March 26, 1968 D. V. BRUCE 3,374,531

METHOD OF SOLDERING WITH RADIANT ENERGY

Filed April 21, 1965

INVENTOR
D.V. BRUCE
BY W.M. Kain
ATTORNEY

United States Patent Office 3,374,531

Patented Mar. 26, 1968

3,374,531

METHOD OF SOLDERING WITH RADIANT ENERGY

David Vernon Bruce, Ewing Township, Mercer County, N.J., assignor to Western Electric Company, Incorporated, New York, N.Y., a corporation of New York Filed Apr. 21, 1965, Ser. No. 449,768
8 Claims. (Cl. 29—498)

ABSTRACT OF THE DISCLOSURE

Radiant energy, such as infrared, is employed to effect a given process, such as soldering a workpiece, without damage to heat sensitive materials were the process is carried out at a temperature deleterious to the heat sensitive materials and the radiant energy is passed through the heat sensitive materials. This is accomplished by employing a radiation transparent heat sink in contact with the heat sensitive material which permits the radiant energy to be passed through the heat sensitive material while conducting sufficient heat away from the heat sensitive material to prevent damage thereto.

This invention relates to a method for passing radiant energy through heat sensitive materials without damage thereto and has particular application in making solder connections in close proximity to heat sensitive workpieces.

Radiant energy heating has been used in many industrial applications, for example, in soldering, curing, sealing, and brazing. Radiant energy is particularly useful as a heating agent because, among other things, it is not necessary to bring a heating element directly in contact with an area to be heated and because radiant energy heating is extremely fast.

Difficulty is often encountered in applying radiant energy to a work area when a heat sensitive material is in close proximity thereto because of possible damage to the heat sensitive material. In many applications the only way to apply heat to a work area involves passing radiant energy directly through such heat sensitive material. This has not previously been possible without damage to the heat sensitive material. For example, it has not been possible to pass radiant energy through heat sensitive materials such as thermoplastic materials used for printed circuit boards to solder workpieces such as printed circuit conductors which are in close proximity to the heat sensitive materials.

It is therefore an object of this invention to provide a method for applying radiant energy to heat sensitive materials without damage thereto.

An additional object of this invention is to provide a method for making solder connections without damage to heat sensitive workpieces in close proximity thereto.

A further object of this invention is to provide a method for passing radiant energy through heat sensitive workpieces without damage thereto.

Another object of this invention is to provide a method for passing radiant energy through a heat sensitive circuit board without damage thereto to solder a given area on the circuit board to a selected area on another circuit board.

With these and other objects in view, this invention contemplates the steps of placing a radiation transparent heat sink in contact with a heat sensitive material and passing radiant energy through the heat sink and into the heat sensitive material. The transparent heat sink permits the application of the radiant energy to and through the heat sensitive material while protecting it from harmful heating.

In the context of this invention, "heat sensitive" materials are defined as materials which are damaged by heat at a temperature below the temperature necessary for a given manufacturing process. For example, in a soldering operation a material which is damaged by heat at a temperature below that required for the soldering operation is heat sensitive.

Figure 1:
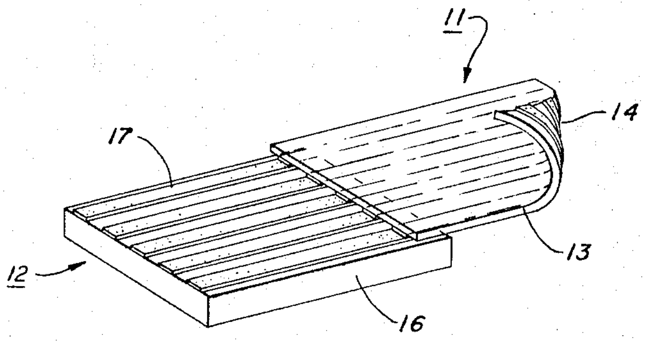
Figure 2:
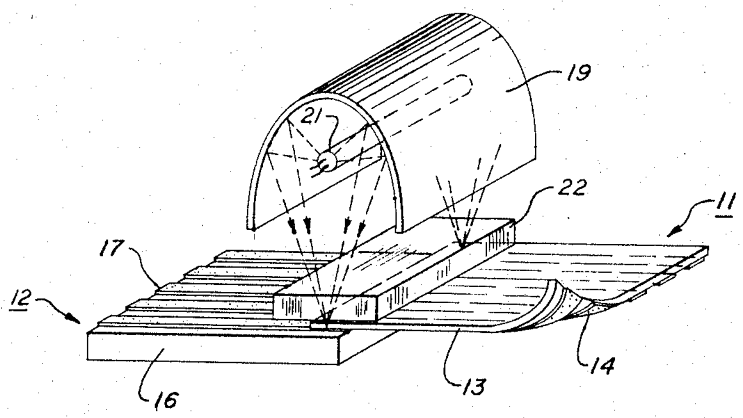

A more complete understanding of the invention may be had by reference to the following detailed description when taken in conjunction with the attached drawings, wherein:

FIG. 1 illustrates a workpiece which is advantageously soldered by the method of this invention; and FIG. 2 shows an apparatus suitable for practicing the method of this invention.

FIG. 1 illustrates a flexible printed circuit board generally indicated by the numeral 11, and a rigid printed circuit board generally indicated by the numeral 12. The flexible circuit board 11 comprises a heat sensitive flexible tape 13 made of a material such as Mylar, and is illustrated as having a plurality of parallel copper conductors 14 formed on one side thereof. The rigid circuit board 12 comprises a rigid base 16 of a material such as epoxy glass, and is illustrated as having a plurality of parallel copper conductors 17 formed on one side thereof.

The conductors 14 and 17 are shown as parallel conductors only for purposes of illustration. These conductors may be formed on their respective bases by any of the many "printed circuitry" techniques and may have any desired configuration.

An application of this invention may be illustrated in using radiant energy to solder selected portions of conductors 14 to selected portions of conductors 17. Referring to FIG. 1, the flexible circuit board 11 is turned over with such selected portions of its conductors 14 in direct contact and in an aligned relationship with conductors 17.

By precoating the conductors 14 and 17 with solder, for example, by conventional plating techniques, a solder connection is achieved merely by the application of sufficient heat to wet the solder. A rosin flux may be advantageously applied to the conductors particularly where the conductors on only one circuit board are solder coated. For example, if conductors 14 are precoated with solder, the rosin flux may be applied to the conductors 17 prior to the soldering operation.

In many applications, the only way to subject conductors 14 and 17 to radiant energy heating is to pass the radiant energy through the heat sensitive tape 13. For example, this becomes necessary when the base 16 is relatively opaque to radiant energy or where it is desirable to solder the conductors on two heat sensitive tapes together. In such applications the danger of damage to the heat sensitive tape due to radiant energy exposure is apparent. Furthermore, since tape 13 is in close proximity to the conductors, heat applied to the conductors is conducted into tape 13 with the likelihood of further damage thereto.

Referring now to FIG. 2, a cylindroidal reflector 19 is illustrated for directing radiant energy to the conductors 14 and 17. A cylindroidal reflector, as defined here, is a reflector formed by a segment of a cylinder having an elliptical right section. A cylindroidal reflector is utilized so that by placing an elongated source 21 of radiant energy along the line defined by one focus of the elliptical right section, the radiant energy will be focused along the line defined by the other focus of the elliptical right section. By bringing the overlapped portions of conductors 14 and 17 into coincidence with the line at which radiant energy from such a reflector is concentrated, radiant energy is readily applied to the conductors.

While a reflector of the geometry above-described is especially useful for practicing the invention in many applications, other geometries suitable for other applications may readily be selected by one with skill in the art.

An elongated tungsten iodine lamp which produces radiant energy having a wavelength primarily in the 0.3 to 3.0 micron range is a suitable source of radiant energy. Other sources of radiant energy such as a carbon arc, plasma, heated filament, or any suitable heated body radiator may also be used.

As illustrated in FIG. 2, a heat sink 22 of a material such as quartz or sapphire which is transparent to the radiant energy from source 17 is placed over the tape 13 in intimate contact therewith. It is desirable to apply sufficient pressure to the heat sink to maintain intimate contact between the heat sink and the heat sensitive tape because the tape 13 is damaged by the passage of radiant energy through or conduction of heat into any area of the tape not effectively cooled by the heat sink. The heat sink 22 may also be used to hold the conductors to be soldered in the desired position.

Radiant energy from source 21 focused by reflector 19 passes through the heat sink 22 and through the heat sensitive tape 13 to heat the conductors 14 and 17 and cause them to solder together. Heat great enough to effect soldering is necessarily applied in close proximity to heat sensitive tape 13. However, heat otherwise sufficient to damage the tape is conducted away from the tape by heat sink 22 so that the tape 13 is not damaged. It is especially noteworthy that the heat sing 22 absorbs heat generated in the heat sensitive tape due to the passage of radiant energy therethrough and also absorbs heat conducted into the tape from conductors 14 and 17.

As noted above, it is desirable for the heat sink 22 to be in direct contact with the heat sensitive material to effectively cool same. The heat sink should also have sufficient heat capacity to prevent the temperature of the heat sensitive material from rising to an unacceptably high level.

By way of example, a Mylar tape approximately 0.001-inch thick and an epoxy glass board approximately 0.04-inch thick may be used respectively as the tape 13 and base 16. The conductors 14 and 17 may be 0.033-inch wide copper conductors having a thickness of 0.0005 inch and spaced from each other 0.011 inch. It has been found that a ¼-inch thick quartz block adequately cools the heat sensitive tape 13 when the circuit boards have the above-enumerated dimensions.

The radiation transparent heat sink may be of any of a wide range of materials, the selection of which will depend upon the application involved. To illustrate, quartz is suitable in most heating applications as it is very transparent to radiant energy in the ultraviolet and visible spectrum and in the infrared region in wavelengths less than 7.0 microns. Sapphire is also suitable particularly where high heat conductivity is desired. If it is desirable to use radiant energy in the infrared spectrum above wavelengths of 7.0 microns, rock salt, sylvine (potassium chloride) and fluorite are transparent materials in this spectral region and can be used.

It is to be understood that the method of this invention is not restricted to any particular manufacturing process. This invention has application in a wide range of activities in which it is desirable to apply heat to an area in close proximity to a heat sensitive material with radiant energy.

For example, this invention has general application where it is desirable to cure a resin covered by heat sensitive material, to affect a metal to glass seal in close proximity to a heat sensitive material, or to braze two pieces together which are in close proximity to a heat sensitive material.

It is to be understood that the above-described arrangements are simply illustrative of the principles of the invention. Other arrangements may be devised by those skilled in the art which will embody the principles of the invention and fall within the spirit and scope thereof.

What is claimed is:

1. A method of applying radiant energy to heat sensitive material without damage thereto wherein the radiant energy is applied at an energy level normally deleterious to the material, comprising the steps of:
placing a radiation transparent heat sink in contact with the material; and
passing radiant energy through the heat sink and into the material, the heat sink conducting heat away from the heat sensitive material to prevent damage thereto.

2. A method for passing radiant energy through a heat sensitive material without damage thereto wherein the heat sensitive material would normally ready a temperature deleterious thereto, comprising the steps of:
placing a radiation transparent heat sink in contact with the heat sensitive material; and
passing radiant energy through the heat sink and the heat sensitive material, the heat sink conducting heat away from the heat sensitive material to prevent any damage thereto.

3. A method for passing radiant energy through a heat sensitive material to apply heat to solder thereby soldering a workpiece, comprising the steps of:
placing a radiation transparent heat sink in contact with the heat sensitive material; and
passing radiant energy through the heat sink and the heat sensitive material to impinge upon the solder and effect soldering of the workpiece, the heat sink conducting heat from the heat sensitive material to prevent damage thereto.

4. A method for heating a workpiece which is in close proximity to heat sensitive material, comprising the steps of:
placing a radiation transparent heat sink in contact with the heat sensitive material; and
passing radiant energy through the heat sink and heat sensitive material to heat the workpiece to a temperature deleterious to the heat sensitive material, the heat sink conducting heat from the heat sensitive material to prevent damage thereto.

5. A method of soldering an area of a heat sensitive circuit board to an area of a second circuit board wherein the area of the heat sensitive circuit board is placed in contact with the area of the second circuit board and the areas are soldered together upon the application of heat thereto, comprising the steps of:
placing a radiation transparent heat sink in contact with the heat sensitive circuit board; and
passing radiant energy through the heat sink and the heat sensitive circuit board to impinge upon the areas to solder same together, the heat sink conducting sufficient heat from the heat sensitive circuit board to prevent damage thereto.

6. A method of soldering a conductive area on a heat sensitive circuit board to a conductive area on a second circuit board wherein the conductive area of the heat sensitive circuit board is placed in contact with the conductive area of the second circuit board and the conductive areas are soldered together upon the application of heat thereto, comprising the steps of:
placing a radiation transparent heat sink in contact with the heat sensitive circuit board on the side opposite the conductive area on the heat sensitive circuit board; and
passing radiant energy through the heat sink and through the area of the heat sensitive circuit board covered by the heat sink to the conductive areas to effect soldering thereof, the heat sink conducting sufficient heat away from the heat sensitive circuit board to prevent damage thereto.

7. A method of soldering conductive areas on a heat sensitive circuit board to selected conductive areas on a second circuit board wherein the conductive areas are soldered together upon the application of heat thereto, comprising the steps of:

aligning the conductive areas of the heat sensitive circuit board in contact with the selected conductive areas of the second circuit board;

placing a radiation transparent heat sink in contact with the side of the heat sensitive circuit board opposite the aligned conductive areas to hold the conductive areas in alignment; and passing radiant energy through the heat sink and through the heat sensitive circuit board to the aligned conductive areas to effect soldering thereof, the heat sink conducting sufficient heat from the heat sensitive circuit board to prevent damage thereto, while permitting sufficient radiant energy to reach the aligned conductive areas to solder same together.

8. A method of soldering conductive areas on a heat sensitive circuit board to selected conductive areas on a second circuit board wherein the conductive areas are soldered together upon the application of heat thereto, comprising the steps of:

aligning the conductive areas of the heat sensitive circuit board in contact with the selected conductive areas of the second circuit board;

placing a quartz block in contact with the side of the heat sensitive circuit board opposite the aligned conductive areas to hold the conductive areas in alignment; and passing radiant energy through the quartz block and through the heat sensitive circuit board to the aligned conductive areas to effect soldering thereof, the heat sink conducting sufficient heat from the heat sensitive circuit board to prevent damage thereto while permitting sufficient radiant energy to reach the aligned conductive areas to solder same together.

References Cited

UNITED STATES PATENTS

| | | | |
|---|---|---|---|
| 743,025 | 11/1903 | Von Orth | 250—43 X |
| 1,968,037 | 7/1934 | Hartman | 250—42 X |
| 2,668,133 | 2/1954 | Brophy et al. | 250—42 X |
| 2,808,777 | 10/1957 | Roshkind | 250—65.1 X |
| 2,976,415 | 3/1961 | Kuhrmeyer | 250—65.1 |
| 3,073,953 | 1/1963 | Cohen et al. | 250—65.1 |
| 3,103,881 | 9/1963 | Grieshaber | 250—65.1 X |
| 3,121,791 | 2/1964 | Russell | 250—65.1 |
| 3,190,200 | 6/1965 | Limberger et al. | |

OTHER REFERENCES

Manko; Solders and Soldering, pp. 202–204, Apr. 2, 1964.

JOHN F. CAMPBELL, *Primary Examiner.*

J. CLINE, *Assistant Examiner.*